(12) United States Patent
Fakhr et al.

(10) Patent No.: US 9,960,061 B2
(45) Date of Patent: May 1, 2018

(54) METHOD AND DEVICE FOR CURING AT LEAST IN PART A PHOTORESIST APPLIED TO A SUBSTRATE

(71) Applicant: SUSS MicroTec Lithography GmbH, Garching (DE)

(72) Inventors: Omar Fakhr, Garching (DE); Dietrich Toennies, Garching (DE)

(73) Assignee: SUSS MicroTec Lithography GmbH (DE)

( * ) Notice: Subject to any disclaimer, the term of this patent is extended or adjusted under 35 U.S.C. 154(b) by 71 days.

(21) Appl. No.: 15/096,494

(22) Filed: Apr. 12, 2016

(65) Prior Publication Data

US 2016/0306280 A1 Oct. 20, 2016

(30) Foreign Application Priority Data

Apr. 15, 2015 (NL) ...................................... 2014642

(51) Int. Cl.

| | | |
|---|---|---|
| B05B 5/00 | (2006.01) |
| H01L 21/67 | (2006.01) |
| H05K 3/12 | (2006.01) |
| G03F 7/004 | (2006.01) |
| G03F 7/40 | (2006.01) |
| F27B 17/00 | (2006.01) |
| G03F 7/38 | (2006.01) |

(52) U.S. Cl.
CPC ...... H01L 21/6715 (2013.01); F27B 17/0025 (2013.01); G03F 7/004 (2013.01); G03F 7/38 (2013.01); G03F 7/40 (2013.01); H01L 21/67098 (2013.01); H01L 21/67103 (2013.01); H01L 21/67109 (2013.01); H01L 21/67115 (2013.01); H05K 3/1283 (2013.01)

(58) Field of Classification Search
CPC ........... H01L 21/0271; H01L 21/67098; H01L 21/67115; F27B 17/0025; G03F 7/004; G03F 7/38; G03F 7/40; H05K 3/1283
USPC ................... 430/270.1, 330, 331; 219/444.1; 118/641; 438/781
See application file for complete search history.

(56) References Cited

U.S. PATENT DOCUMENTS

| | | | |
|---|---|---|---|
| 7,828,487 B2 * | 11/2010 | Park ........................ | G03F 7/038 165/218 |
| 2007/0295276 A1 | 12/2007 | Quach et al. | |
| 2008/0099181 A1* | 5/2008 | Ramanan .......... | H01L 21/67109 165/61 |

(Continued)

Primary Examiner — Amanda C Walke
(74) Attorney, Agent, or Firm — Hayes Soloway PC

(57) ABSTRACT

A method for curing at least in part a photoresist applied to a substrate comprises the following steps: The substrate coated with the photoresist is arranged on a support. The photoresist is subjected to a suitable temperature for curing the photoresist for a first predetermined time period. After the first predetermined time period has passed, the substrate is lifted from the support, rotated, re-placed onto the support and subjected to a suitable temperature for curing the photoresist for a second predetermined time period. This method can be performed with a device for curing at least in part a photoresist applied to a substrate, comprising a chamber, a support which is arranged in the chamber and on which the substrate can be arranged, and a rotating device for rotating the substrate between a first and a second phase of the curing of the photoresist.

12 Claims, 1 Drawing Sheet

(56) References Cited

U.S. PATENT DOCUMENTS

| | | | |
|---|---|---|---|
| 2009/0001071 A1* | 1/2009 | Kulkarni | H01L 21/67225 219/444.1 |
| 2009/0286407 A1* | 11/2009 | Yang | H01L 21/0273 438/795 |
| 2010/0151696 A1 | 6/2010 | Ito et al. | |
| 2011/0034015 A1* | 2/2011 | Yoshino | F27B 17/0025 438/585 |
| 2012/0091110 A1* | 4/2012 | Kaneyama | G03F 7/38 219/201 |
| 2013/0118685 A1* | 5/2013 | Hara | G02B 3/0031 156/309.6 |
| 2015/0279662 A1* | 10/2015 | Zhang | H01L 21/02104 427/58 |
| 2016/0027666 A1* | 1/2016 | Rogers | H01L 21/31058 438/127 |
| 2016/0351423 A1* | 12/2016 | Yang | H01L 21/67115 |

* cited by examiner

METHOD AND DEVICE FOR CURING AT LEAST IN PART A PHOTORESIST APPLIED TO A SUBSTRATE

The invention relates to a device for curing at least in part a photoresist applied to a substrate. The invention further relates to a method for curing at least in part a photoresist applied to a substrate.

BACKGROUND OF THE INVENTION

The method and the device mentioned above are used in connection with photolithography methods by which microstructured components, for example semiconductor chips or microelectromechanical systems (MEMSs), can be produced. A first step of production methods of this type involves coating a substrate ("wafer") with a photoresist ("resist"). The photoresist is subsequently exposed, for example through a mask, changing to a curtain extent the physical and/or chemical properties of the photoresist. The photoresist can subsequently be removed in part.

Before the photoresist is removed in part, it has to be cured. This may take place in several steps, for example in a pre-curing ("softbake") before the photoresist is exposed and a subsequent actual curing.

For curing, the substrate coated with the photoresist may be arranged on a heated receptacle ("hotplate"), in such a way that a greater or lesser part of the solvent contained in the photoresist is evaporated under the effect of the supplied heat.

However, it has been found that the photoresist has a different thickness after being cured (in part or in full) even if it was spread uniformly on the substrate during coating. This has a disadvantageous effect on the microstructures subsequently to be produced.

The object of the invention is to provide a method and a device by means of which the photoresist can be cured on the substrate in such a way that it has as uniform a thickness as possible.

BRIEF DESCRIPTION OF THE INVENTION

To achieve this object, the invention provides a method for curing at least in part a photoresist applied to a substrate, in which the following steps are carried out. The substrate coated with the photoresist is arranged on a support. The photoresist is subjected to a suitable temperature for curing the photoresist for a first predetermined time period. After the first predetermined time period has passed, the substrate is lifted from the support, rotated, re-placed on the support and subjected to a suitable temperature for curing the photoresist for a second predetermined time period. To achieve the stated object, the invention also provides a device for curing at least in part a photoresist applied to a substrate, comprising a chamber, a support which is arranged in the chamber and on which the substrate can be arranged, and a device for rotating the substrate between a first and a second phase of the curing of the photoresist relative to the support.

The invention is based on the finding that orientation errors of the support often result in the cured photoresist having a non-uniform thickness. Simply put, if the support is arranged obliquely the photoresist runs towards the lower side under the effect of gravity. This results in a larger layer thickness there when the photoresist is being cured. The invention is based on the underlying idea of rotating the substrate during the curing of the photoresist such that the photoresist is given the chance to distribute itself uniformly on the substrate during the orientation.

In a simplified example, it is assumed that the support on which the substrate is arranged for curing the photoresist is orientated slightly obliquely, in such a way that the photoresist flows from right to left. Once the first predetermined time period has elapsed, the substrate is rotated through 180° such that the region of the substrate previously arranged on the left is now arranged on the right side of the support. As a result, the photoresist which flowed into this region previously during the first time period flows back in the opposite direction. If the first and second time periods are suitably selected, the effect of the oblique positioning of the support is compensated (at least to a noticeable extent).

It is naturally possible for the substrate to be rotated not just once but also repeatedly during the curing of the photoresist. In this context, complex "patterns" of rotation of the substrate may also be used, for example using different angles of rotation and different time periods.

In one embodiment of the invention, the time periods differ from one another. In particular, in this context it may be provided that a time period used at an earlier point in the curing is shorter than a time period used at a later time. This takes into account the fact that the flowability of the photoresist becomes less and less with increasing curing. Thus, keeping to the above example of rotation through 180°, the second time period has to be longer than the first time period for the same amount of photoresist to flow back during the second time period as during the first time period.

In one embodiment of the invention, in this context the support is arranged in a chamber and the substrate is removed from the chamber for rotation. This is advantageous in that there is more space for handling the substrate outside the chamber.

In one embodiment of the invention, after the photoresist has cured, the substrate is deposited on a holder and cooled, the substrate being rotated relative to the holder at least once during the cooling. This embodiment continues the underlying of the invention whereby orientation errors of the component on which the support is deposited (in this case the holder which holds the substrate during the cooling) can be compensated by depositing the substrate differently in a predetermined time pattern.

If the support is stationary and the substrate is arranged in different orientations on the support, the device for rotating the substrate is preferably a handling device which can receive the substrate from the support and deposit it again rotated. This makes it possible to rotate the substrate in an automated manner.

The handling device may in principle be formed in such a way that it can rotate the substrate itself. Alternatively, the handling device may comprise a rotary disc on which the substrate can be deposited in the interim periods. This makes is possible to configure the handling device (for example a robot arm) mechanically simpler, since it does not have to rotate the substrate.

To accelerate the curing of the photoresist, the support is preferably provided with a heater. This is a well-known construction ("hotplate") by means of which the photoresist can be heated by thermal conduction from the support through the substrate in accordance with a predetermined temperature profile.

Alternatively or in addition, a heating device may be provided by means of which the temperature of an atmosphere in the chamber can be controlled. In this way, heat can also be supplied to the photoresist from the upper face.

In one embodiment of the invention, a control system is provided having a memory in which a curing profile can be stored. This curing profile contains information concerning time periods and angles of rotation which lead to the cured photoresist having as uniform a layer thickness as possible on the substrate. A curing profile of this type may for example be determined by way of various test runs after the device has been installed for a customer. By way of the test runs, for example coated substrates having different curing profiles predetermined by the manufacturer can be treated. Subsequently, the layer thickness of the cured photoresist on the different substrates is measured. Subsequently, either the curing profile is selected for which the desired layer thickness of the cured photoresist is achieved as well as possible, or further iteration cycles, by way of which curing profiles stored in the memory are ultimately even further refined, are carried out using the measured layer thicknesses.

BRIEF DESCRIPTION OF THE DRAWINGS

In the following, the invention is disclosed in greater detail with reference to an embodiment, which is shown in the accompanying drawings, in which.

DETAILED DESCRIPTION OF THE INVENTION

Figure 1:
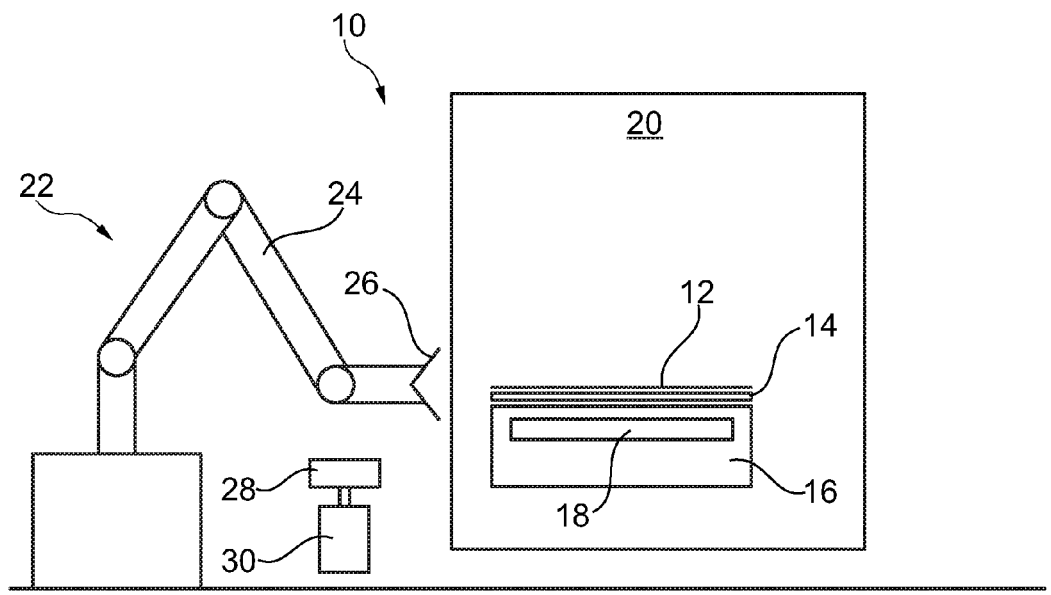
FIG. 1 schematically shows a device according to the invention.

FIG. 1 shows a device 10 for curing at least in part a photoresist 12 with which a substrate 14 is coated. The substrate 14 may be a wafer which is microstructured in a subsequent process. In this context, the photoresist 12 is suitably exposed such that the physical and/or chemical properties thereof change and it can be removed in part in a subsequent step.

So as to be able to apply the photoresist 12 uniformly on the surface of the substrate 14, it is very low-viscosity; the solvent proportion is high. For further processing, initially part of the solvent has to be removed from the photoresist 12. For this purpose, the substrate 14 coated with the photoresist 12 is deposited on a support 16 which is provided with a heater 18. By means of the heater 18, heat is supplied to the substrate 14 and thus to the photoresist 12, and this accelerates the process of evaporating the solvent contained in the photoresist 12 and thus the curing of the photoresist 12.

If additionally desired, a heating device (not shown in FIG. 1) may be provided by means of which the atmosphere inside a chamber 20 in which the support 16 is located can be heated.

Further components of the device which are usually present (for example a suction duct for removing the solvent-laden atmosphere and supplying a rinsing gas) are not shown here, since they are not necessary for understanding the invention.

Figure 2:
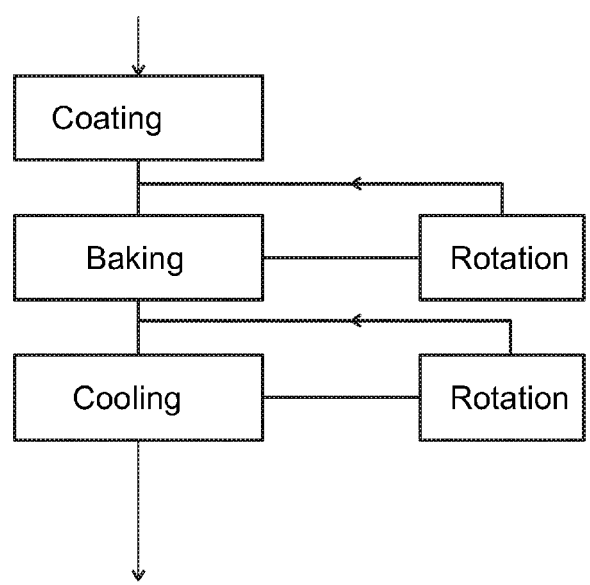
FIG. 2 is a schematic block diagram of the method according to the invention.

It cannot always be reliably provided that the support 16 is orientated absolutely horizontally. As soon as there are small orientation errors, the photoresist flows slightly to side which is arranged lower under the effect of gravity. To compensate this, the invention provides that the substrate 14 initially remains on the support 16, where the photoresist 12 cures somewhat, for a first time period. Subsequently, the substrate 14 and thus the photoresist 12 located thereon are rotated through a predefined angle, and the photoresist 12 cures for a second time period (see also FIG. 2). This sequence can be repeatedly several times if desired. In this context, the time periods during which the photoresist 12 cures before the substrate 14 is rotated onwards may differ from one another.

In principle, it is possible to rotate the substrate 14 onwards manually between the individual time periods during which the photoresist 12 cures. However, the repositioning of the substrate 14 is preferably automated.

A device for rotating the substrate 14 may be used for this purpose, and in this case is configured as a handling device 22. This comprises a robot arm 24 having a gripper 26, by means of which the substrate 14 can be deposited on and removed from the support 16. The handling device 22 further comprises a rotary disc 28, which is driven by a stepper motor 30. To rotate the substrate 14 through a desired angle, it is removed from the chamber by the robot arm 24, placed on the rotary disc, where it is rotated through the desired angle by said disc, and subsequently placed back on the support 16 in the chamber 16 by way of the robot arm 24.

Once the photoresist has cured sufficiently (in various orientations on the support), it is usually cooled in a controlled manner. For this purpose, it is deposited on a holder (not shown in the drawings), where the substrate 14 can likewise be rotated regularly in a predetermined pattern so as to compensate any orientation errors of the holder (see also FIG. 2).

The invention claimed is:

1. A method for curing at least in part a photoresist applied to a substrate, wherein the following steps are carried out:
said substrate carrying a coating comprising a photoresist is being arranged on a support;
said photoresist is subjected to a suitable temperature for curing said photoresist for a first predetermined time period;
after said first predetermined time period has passed, said substrate is lifted from said support, rotated, re-placed onto said support and subjected to a suitable temperature for curing said photoresist for a second predetermined time period.

2. The method of claim 1 wherein after said second predetermined time period has passed, said substrate is rotated again and subjected to a suitable temperature for curing said photoresist for a third predetermined time period, wherein a sequence of rotating said substrate and continuing curing of said photoresist being optionally repeated.

3. The method of claim 1 wherein said time periods differ from one another.

4. The method of claim 3 wherein said first time period is shorter than said second time period.

5. The method of claim 1 wherein said support is arranged in a chamber and said substrate is removed from said chamber for being rotated.

6. The method of claim 1 wherein after said photoresist has cured, said substrate is deposited on a holder and cooled, said substrate being rotated relative to said holder at least once during cooling.

7. A device for curing at least in part a photoresist applied to a substrate, comprising a chamber, a support which is arranged in said chamber and on which said substrate can be arranged, and a rotating device for lifting and rotating said substrate relative to said support between a first and a second phase of curing of said photoresist.

8. The device of claim 7 wherein said device for rotating the substrate is a handling device which can receive the substrate from the support and deposit it again rotated.

9. The device of claim 8 wherein said handling device comprises a rotary disc on which said substrate can be deposited in interim periods.

10. The device of claim 7 wherein said support is provided with a heater.

11. The device of claim 7 wherein a heating device is provided for controlling a temperature of an atmosphere in said chamber.

12. The device of claim 7 wherein a control system is provided, said control system having a memory in which a curing profile is being stored.

* * * * *